(12) United States Patent
Schweickert et al.

(10) Patent No.: US 7,113,437 B2
(45) Date of Patent: Sep. 26, 2006

(54) SENSE AMPLIFIER SYSTEMS AND A MATRIX-ADDRESSABLE MEMORY DEVICE PROVIDED THEREWITH

(75) Inventors: Robert Schweickert, Greenacres, FL (US); Geirr I. Leistand, Oslo (NO)

(73) Assignee: Thin Film Electronics ASA, Oslo (NO)

( * ) Notice: Subject to any disclaimer, the term of this patent is extended or adjusted under 35 U.S.C. 154(b) by 42 days.

(21) Appl. No.: 10/808,513

(22) Filed: Mar. 25, 2004

(65) Prior Publication Data

US 2005/0105358 A1    May 19, 2005

(30) Foreign Application Priority Data

Mar. 26, 2003  (NO)  ................... 2003-1364

(51) Int. Cl.
  G11C 7/06   (2006.01)
  G11C 7/14   (2006.01)
  G11C 11/22  (2006.01)

(52) U.S. Cl. ............... 365/207; 365/145; 365/210; 365/189.07; 365/189.09

(58) Field of Classification Search ............. 365/145, 365/185.2, 189.07, 189.09, 207, 208, 209, 365/210
See application file for complete search history.

(56) References Cited

U.S. PATENT DOCUMENTS

| | | | |
|---|---|---|---|
| 5,218,566 A | 6/1993 | Papaliolios | |
| 5,524,093 A * | 6/1996 | Kuroda | 365/145 |
| 5,572,474 A | 11/1996 | Sheen et al. | |
| 5,638,322 A | 6/1997 | Lacey | |
| 5,999,439 A | 12/1999 | Seyyedy | |
| 6,385,111 B1 * | 5/2002 | Tran et al. | 365/210 |
| 6,522,568 B1 * | 2/2003 | Nair | 365/145 |
| 6,611,448 B1 * | 8/2003 | Nair et al. | 365/145 |
| 6,788,563 B1 * | 9/2004 | Thompson et al. | 365/145 |
| 6,809,976 B1 * | 10/2004 | Ooishi | 365/210 |
| 6,876,567 B1 * | 4/2005 | Chow | 365/145 |
| 6,914,839 B1 * | 7/2005 | Chow et al. | 365/207 |
| 2003/0031059 A1 | 2/2003 | Endo et al. | |

FOREIGN PATENT DOCUMENTS

| | | |
|---|---|---|
| EP | 0712135 A2 | 5/1996 |
| WO | WO0205288 A1 | 1/2002 |

* cited by examiner

Primary Examiner—Richard Elms
Assistant Examiner—J. H. Hur
(74) Attorney, Agent, or Firm—Birch, Stewart, Kolasch & Birch, LLP

(57) ABSTRACT

A charge sensing device with a sense amplifier system implemented in a non-volatile matrix-addressable memory device comprising an electrical polarizable dielectric memory material exhibiting hysteresis, particularly a ferroelectric or electret material. The memory cells of the memory device can be selectively addressed for a write/read operation and the sense amplifier system is used for readout of polarization states of the memory cells.

20 Claims, 8 Drawing Sheets

Figure 1:
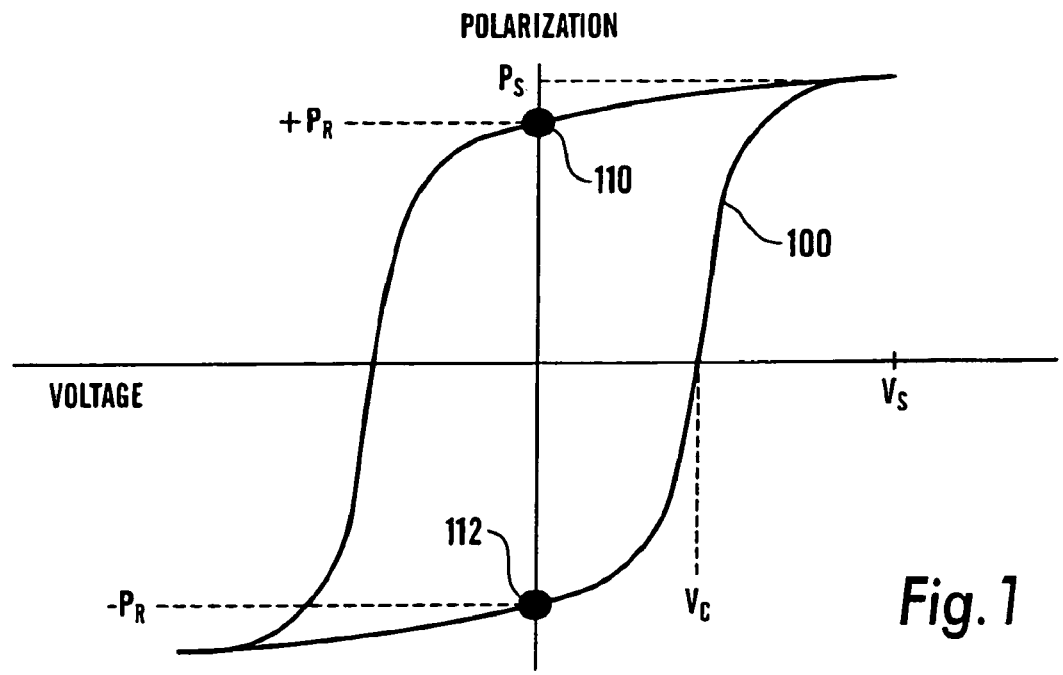

SENSE AMPLIFIER SYSTEMS AND A MATRIX-ADDRESSABLE MEMORY DEVICE PROVIDED THEREWITH

The present invention concerns a charge sensing device comprising charge reference means and sense amplifier system, particularly for sensing the charge of a passive addressable charge-storing means. The present invention also concerns a charge sensing device for sensing the charges of a plurality of passive addressable charge storing means.

The present invention finally concerns a non-volatile passive matrix-addressable memory device comprising an electrically polarizable dielectric memory material exhibiting hysteresis, particularly a ferroelectric or electret material, wherein said memory material is provided in a layer contacting a first set and second set of respective parallel addressing electrodes, wherein the electrodes of the first set constitute word lines of the memory device and are provided in substantially orthogonal relationship to the electrodes of the second set, the latter constituting bit lines of the memory device, wherein memory cells with a capacitor-like structure are defined in the memory material at the crossings between word lines and bit lines, wherein each memory cell can be selectively addressed for a write/read operation via a word line and bit line, wherein a write operation to a memory cell takes place by establishing a desired polarization state in the cell by means of a voltage being applied to the cell via the respective word line and bit line defining the cell, wherein said applied voltage either establishes a determined polarization state in the memory cell or is able to switch between the polarization states thereof, wherein a read operation takes place by applying a voltage to the memory cell and detecting at least one electrical parameter of an output current on the bit lines, and wherein a one or more charge sensing devices according to the invention are provided for sensing said polarization states of said memory cells during a read operation.

Ferroelectrics which property constitutes a subclass of electrodes are electrically polarizable materials that possess at least two equilibrium orientations of the spontaneous polarization vector in the absence of an external electrical field, and in which the spontaneous polarization vector may be switched between those orientations by an electric field. The memory effect exhibited by materials with such bistable states of remanent polarization can be used in memory applications. One of the polarization states is considered to be a logic "1" and the other a logic "0". Typical passive matrix addressing memory applications are implemented by letting two sets of parallel electrodes cross each other, normally in an orthogonal fashion, in order to create a matrix of cross-points that can be individually accessed electrically by selective excitation of the appropriate electrodes from the edge of the matrix. A layer of ferroelectric material is provided between the electrode sets in a capacitor like manner so that the cross-points can function as memory cells. When applying potential differences between two electrodes, the ferroelectric material in the cell is subjected to an electric field which generates a polarization response generally tracing a hysteresis curve or a portion thereof. By manipulating the direction and the magnitude of the electric field, the memory cell can be left in a desired logic state. The passive addressing of this type of arrangement leads to simplicity of manufacture and a high density of cross-points.

One set of parallel electrodes is usually referred to as word lines while the other set is referred to as bit lines. The electronic circuitry performs driving and sensing operations on the memory matrix by employing a timing sequence that consists of a voltage vs. time protocol. Potentials on selected word and bit lines are controlled so as to approach or coincide with one of a few predefined potential levels during the driving and sensing operations. The bit lines are further connected to circuitry that senses the charges flowing between the bit lines and the cells connecting to said bit lines within a certain period of the timing sequence. This latter circuitry includes sense amplifiers. Sense amplifiers generally compare the polarization response of memory cells to the value of a voltage or charge reference. A number of different techniques can be used to create the reference value. Assuming stable and predictable conditions, a parasitic contribution may in principle be removed by subtracting a fixed amount of charge from that recorded by the sense amplifier during the reading cycle. However, the magnitude and variability of the parasitic contribution makes this inappropriate in many instances. In addition to manufacturing tolerances, the fatigue and imprint history may vary within wide limits between different cells in the same memory device and the parasitic current associated with the active bit line may depend on the actual logic states of the non-addressed cells on that bit line. Thus, reference levels can be obtained from neighbouring cells to deal with these problems.

A reference voltage circuit used for determining the polarization state of a ferroelectric capacitor is presented in U.S. Pat. No. 5,218,566 (Papaliolios). The circuit includes a pair of ferroelectric capacitors, each polarized to an opposite polarization state, that discharge their stored charges into respective sense capacitors. By short-circuiting the sense capacitors a reference voltage is obtained that can be used to compare memory cell signals generated by other ferroelectric capacitors. U.S. Pat. No. 5,999,439 (Seyyedy) describes a similar approach wherein a multiplexed sense amplifier is used to compare data stored on a memory cell with a single-ended reference voltage generated from a pair of reference cells. However, both these circuits have active matrix addressing memories which makes the requirements on the sense amplifiers less demanding. In a passive matrix addressing memory there are significantly lower input signals, and neither Papaliolios nor Seyyedy teach any solution to this problem.

A pseudo-differential sense amplifier is described in U.S. Pat. No. 5,572,474 (Sheen & al.) that senses the state of an array memory cell by reference to reference cell in a predetermined state. The sense amplifier has an input stage coupled to the array memory cell, which provides signals to a differential stage from which an output is generated. The input stage has reference and array side cascode circuits in which the components are matched on each side so as to eliminate process, temperature, and other extraneous variations from influencing the differential output. However, the teachings of Sheen et al. are reliant on the benefit of a MOS transistor's gain and do not achieve the auto-zero offset cancellation and excellent charge balance needed.

U.S. Pat. No. 5,638,322 (Lacey) describes a pseudo-differential sense amplifier having improved common-mode noise rejection. The sense amplifier is connected to a memory cell via an array path and generates an output signal indicative of the state of the memory cell. The sense amplifier includes an array load device connected via an array node to the array path, a reference load device connected via a reference node to a reference path, a differential stage having a first input connected to the reference node, a second input connected to the array node and an output generating the output signal. The sense amplifier further includes a balancing device, connected to the reference node, for compensating a change in signal, caused by a noise event, at the array node and, thus reducing a delay in the response of the sense amplifier when a transition in the state of the cell occurs. However, the memory element is a MOSFET that amplifies the signal and Lacey does not teach how to achieve a pseudo-differential sense amplifier with gain and accuracy for the requirements of a ferroelectric memory.

Thus it is a primary object of the present invention to provide a charge sensing device with a sense amplifier system that is particularly suited for use with polymer ferroelectric memory material in the form of thin films, as well as a non-volatile passive matrix-addressable memory device employing one such sense amplifier system.

Particularly it is an object of the present invention to provide a charge sensing device with a sense amplifier system that has improved charge balance when a reference voltage is generated by using a pair of ferroelectric capacitors, each polarized to an opposite polarization state.

Further it is also an object of the present invention to provide a sense amplifier system which shall be able to control output common-mode voltage and common-mode self-bias generation as well as auto-zero offset cancellation.

The above objects as well as further features and advantages are also realized according to the invention with a charge sensing device which is characterized in comprising a pair of a first and second charge reference means connected in parallel and similar to the charge-storing means, said first charge reference means having the opposite polarization of the second charge reference means, said first and second charge reference means and the charge-storing means having a common input node; first and second pseudo-differential reference sense amplifiers both being connected with output nodes of the respective charge reference means, said first and second pseudo-differential amplifiers being adapted for generating output reference signals to a common reference node; and a pseudo-differential sense amplifier having a first input connected with the common reference node for receiving a common reference input signal and a second input for receiving an output signal from the charge-storing means; whereby the pseudo-differential sense amplifier is enabled to perform a threshold comparison and generating an output sense signal indicative of a polarization state of the charge-storing means.

In the charge sensing device both the pseudo-differential reference sense amplifier and the pseudo-differential sense amplifiers are identical pseudo-differential sense amplifier circuits.

Preferably each pseudo-differential sense amplifier circuit comprises input differential pair transistors connected with a pair of cascoded transistors, and current source biasing pair transistors cascoded with a pair of transistors, said cascoding in each case increasing sense amplifier open-loop gain. The input transistors can then be p-channel transistors and the current-source transistors n-transistors or vice versa.

Preferably each pseudo-differential sense amplifier circuit comprises a semi-balanced dual input with balanced dual output.

Preferably each pseudo-differential sense amplifier circuit comprises a switched capacitor common feed-back loop to control output common mode voltage.

Preferably each pseudo-differential sense amplifier circuit comprises means for integral switched capacitor common mode self-bias generation.

Preferably each pseudo-differential sense amplifier circuit comprises an integral positive feed-back latch.

Preferably each pseudo-differential sense amplifier circuit comprises means for auto-zero offset cancellation.

The above objects as well as further features and advantages are also realized according to the invention with a charge sensing device which is characterized in comprising at least two pairs of a first and a second charge reference means similar to the charge-storing means, said first charge reference means having the opposite polarization of the second charge reference means; each of said at least two pairs of charge reference means having a common input node and a pair of common output nodes connected with said first and said second charge reference means in each of said at least two pairs thereof, each common input node of said at least two pairs of charge reference means moreover being connected with at least two charge storing means; first and second pseudo-differential reference sense amplifiers being respectively connected with the first common output node and the second common output node of the charge reference means, said first and second pseudo-differential reference sense amplifiers being adapted for generating output reference signals to a common reference node; and at least two pseudo-differential sense amplifiers, each having a first input connected with said common reference node for receiving a common reference input signal and a second input respectively being connected with a common output node of respective one of said at least two charge-storing means for receiving respective output signals therefrom, said at least two charge-storing means forming the elements of an orthogonal row and column array thereof and with each of the charge-storing means of a row being connected to one of said at least two common input nodes and each of the charge-storing means of a column being connected to a common output node; whereby each pseudo-differential sense amplifier is enabled to perform a threshold comparison and generating an output sense signal indicative of a polarization state of a selected charge-storing means connected therewith.

In a preferred embodiment of this charge sensing device the common input nodes form a portion of the word-line electrodes of a matrix-addressable array of charge-storing memory cells, the common output nodes of the charge reference means form a pair of reference bit-line electrodes; the common output nodes of the charge storing means form bit-line electrodes of said matrix-addressable array; each of the reference bit-line electrodes are assigned to the first and second pseudo-differential reference sense amplifiers respectively; and each of the other bit-line electrodes are assigned to one of the pseudo-differential sense amplifiers, whereby in a readout cycle a polarization state of respective selected charge-storing memory cells can be detected either sequentially or in parallel and compared with a reference value.

In this preferred embodiment a charge sensing device advantageously can be provided as a subblock in block of more than one charge sensing device of this kind, such that the sense amplifiers of a subblock are assigned to a corresponding number of bit line electrodes in the matrix-addressable array; and the pair of reference bit lines of respective subblocks are distributed among the bit lines of array. Alternatively the charge sensing device advantageously can comprise a multiplexer connected with the bit line electrodes of the matrix-addressable array; a number of consecutive bit lines in the array defining a segment of all word line electrodes therein, said number of segment-defining bit lines corresponding to the number of pseudo-differential sense amplifiers in the charge sensing device; and a pair of reference bit line electrodes provided adjacent to the bit line electrodes in each word line segment and connecting pairs of reference charge-storing means in each word line segment; whereby the charge-storing memory cells on a single word line electrode of a word line segment may be read in parallel, and all word line segments similarly in turn by applying an appropriate addressing protocol and multiplexing the bit line electrodes of selected word line segment to establish their parallel connection to respective pseudo-differential sense amplifiers of the charge sensing device as provided.

Finally, the above-mentioned objects as well as further features and advantages are realized according to the invention with a non-volatile matrix-addressable memory device which is characterized in that a pseudo-differential sense amplifier system comprising at least one system subblock, and that said at least one system subblock comprises at least one pseudo-differential sense amplifier circuit for sensing a polarization state of at least one memory cell during said read operation and at least one pseudo-differential reference sense amplifier circuit for sensing polarization state of at least one reference memory cell during said read operation, said at least one former circuit being connected with said at least latter circuit via a common node said at least one charge sensing device is a pseudo-differential sense amplifier system comprising at least one system subblock (SB), and that said at least one system subblock (SB) comprises at least one pseudo-differential sense amplifier circuit (SA) for sensing a polarization state of at least one memory cell (801) during said read operation and two reference sense amplifier circuits ($RSA_1$, $RSA_2$) for sensing a polarization states of two reference memory cells (800) during said read operation, said reference ferroelectric memory cells (800) having opposite polarization states, said pseudo-differential reference sense amplifier circuit ($RSA_1$, $RSA_2$) being connected with said at least one pseudo-differential sense amplifier circuit (SA) via a common node.

In an advantageous embodiment of the memory device according to the present invention the at least one system subblock comprises a plurality of said pseudo-differential sense amplifier circuits for sensing respective polarization states of a corresponding a plurality of memory cells during said read operation.

In another advantageous embodiment of the memory device according to the present invention the first and second reference amplifier circuits are preferably adapted for generating an average of a first and a second reference memory cell output signal to said common node; and the at least one sense amplifier circuit connected therewith is adapted for comparing the output signal at said common node with the output signal from a memory cell.

Advantageously the at least one sense amplifier circuit and the at least one sense amplifier circuit are realized with identical amplifier circuitry, and then preferably the identical amplifier circuitry then comprises a reference side and an array side, said reference side mirroring the circuit structure of said array side.

In a further advantageous embodiment of the memory device according to the invention the pseudo-differential sense amplifier system comprises a plurality of subblocks.

In a yet further advantageous embodiment of the memory device according to the invention each subblock comprises a plurality of said sense amplifier circuits for sensing the polarization state of a corresponding number of memory cells.

Figure 2A:
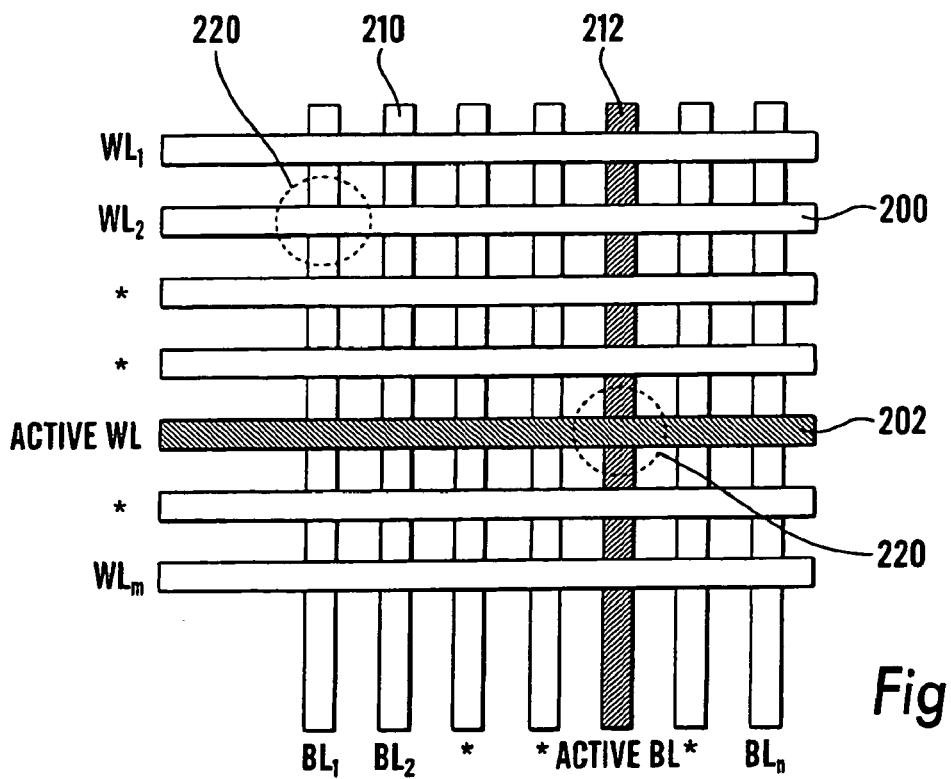
Figure 2B:
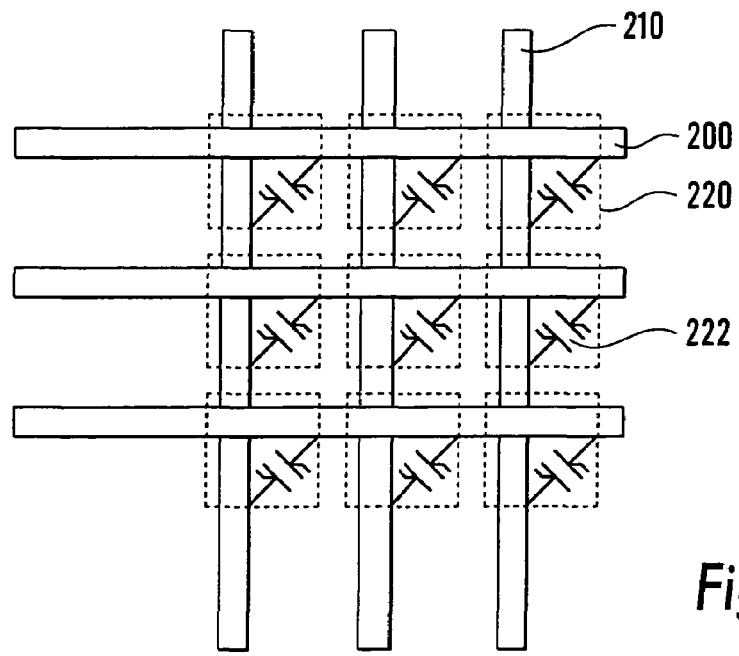
Figure 3:
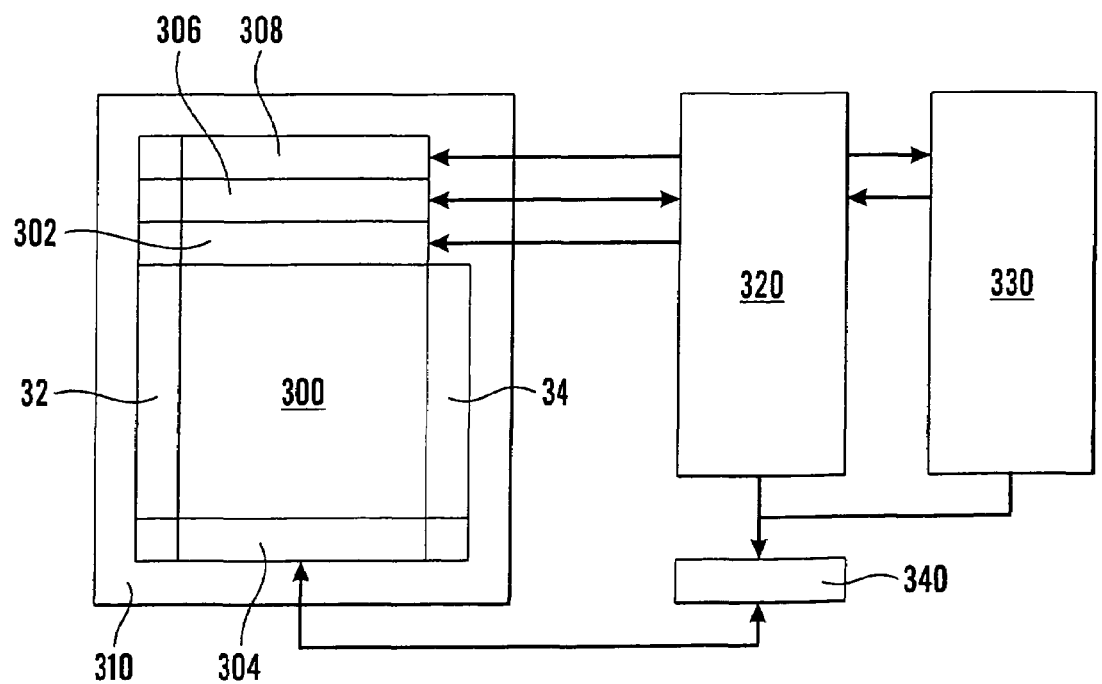
Figure 4:
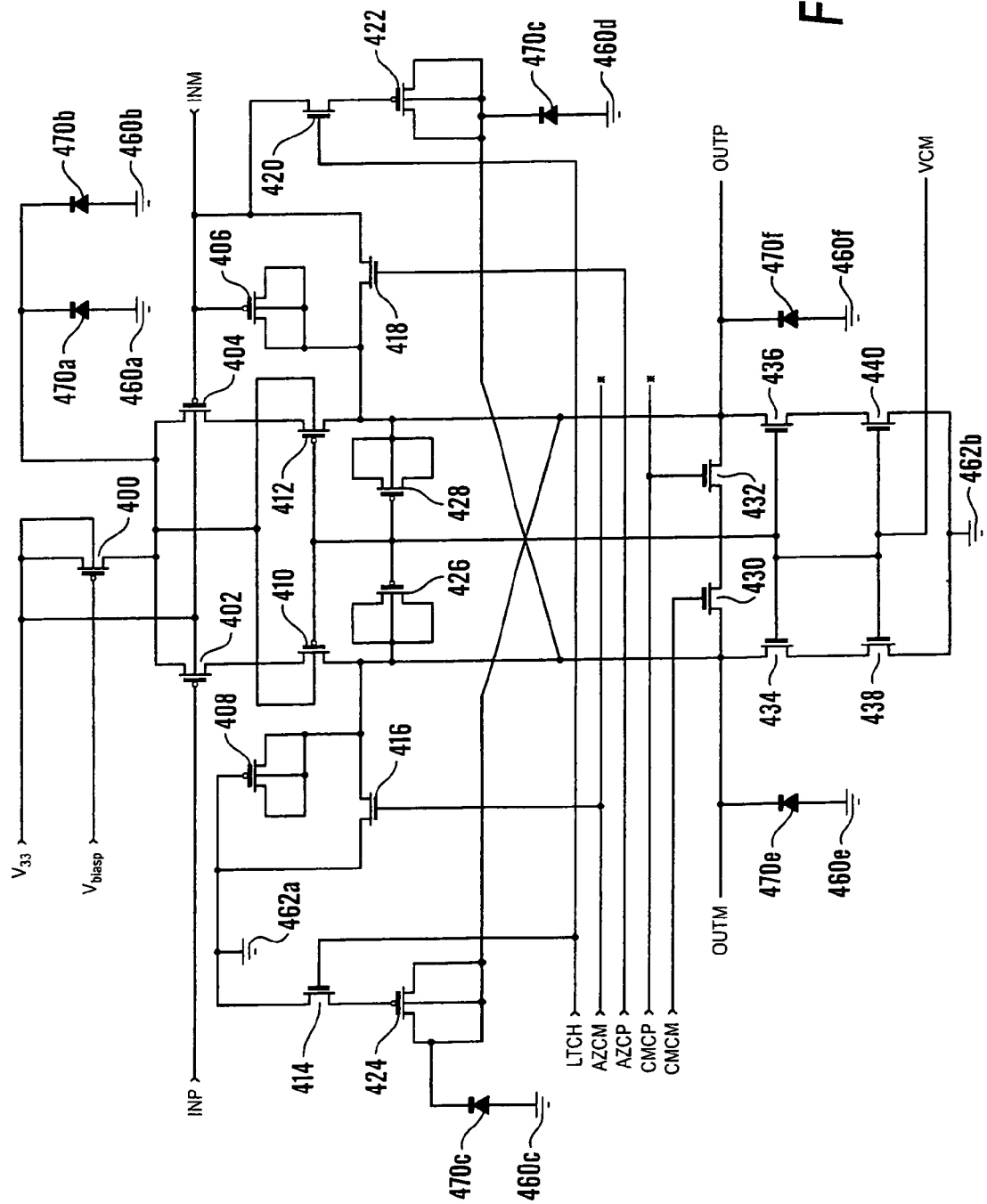
Figure 5:
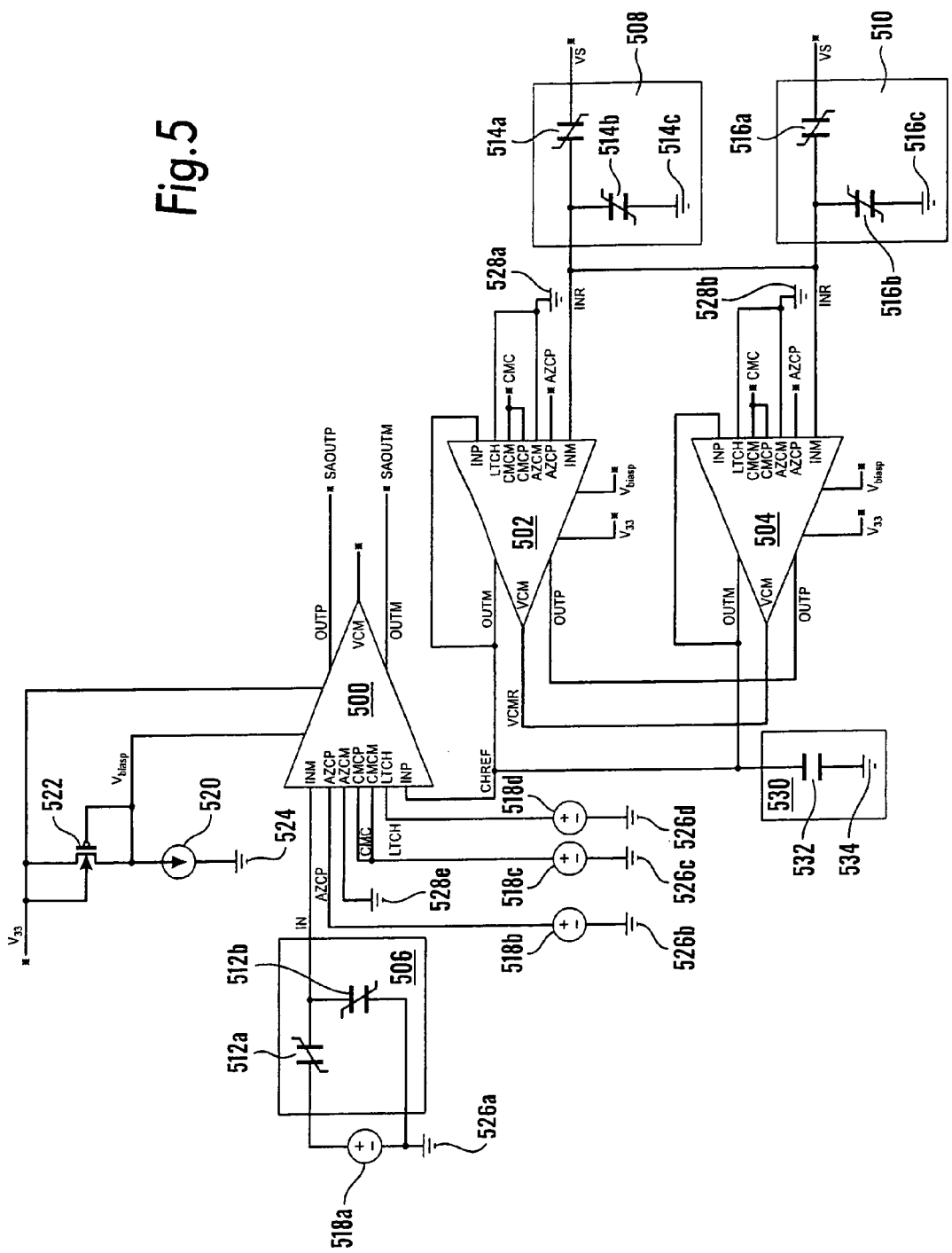
Figure 6:
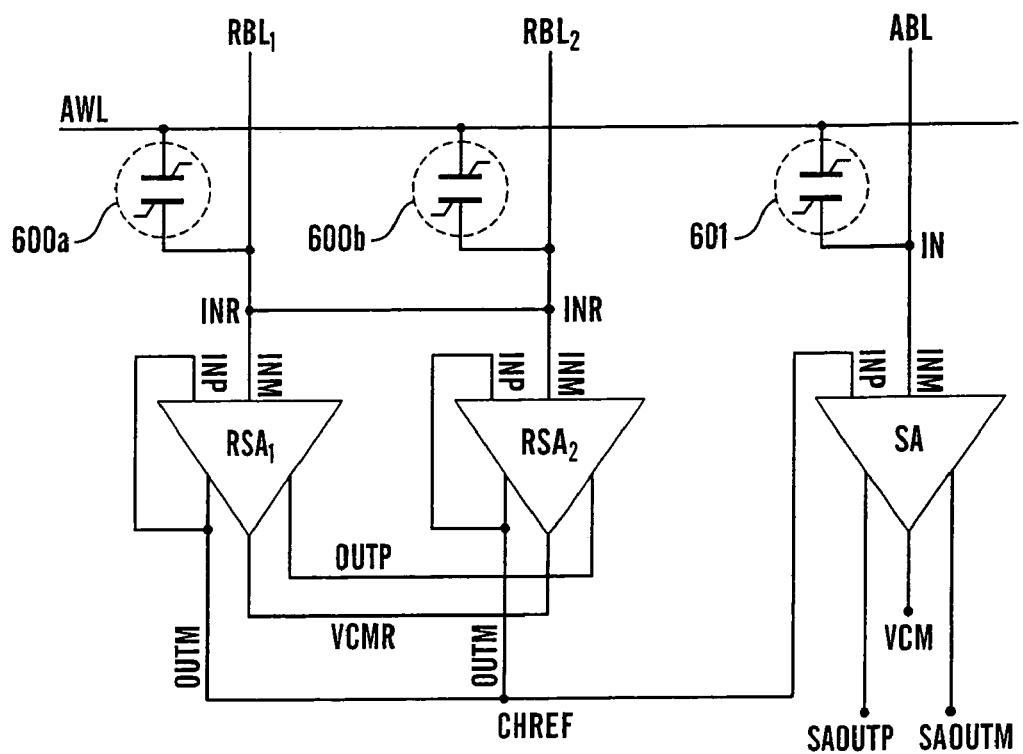
Figure 7:
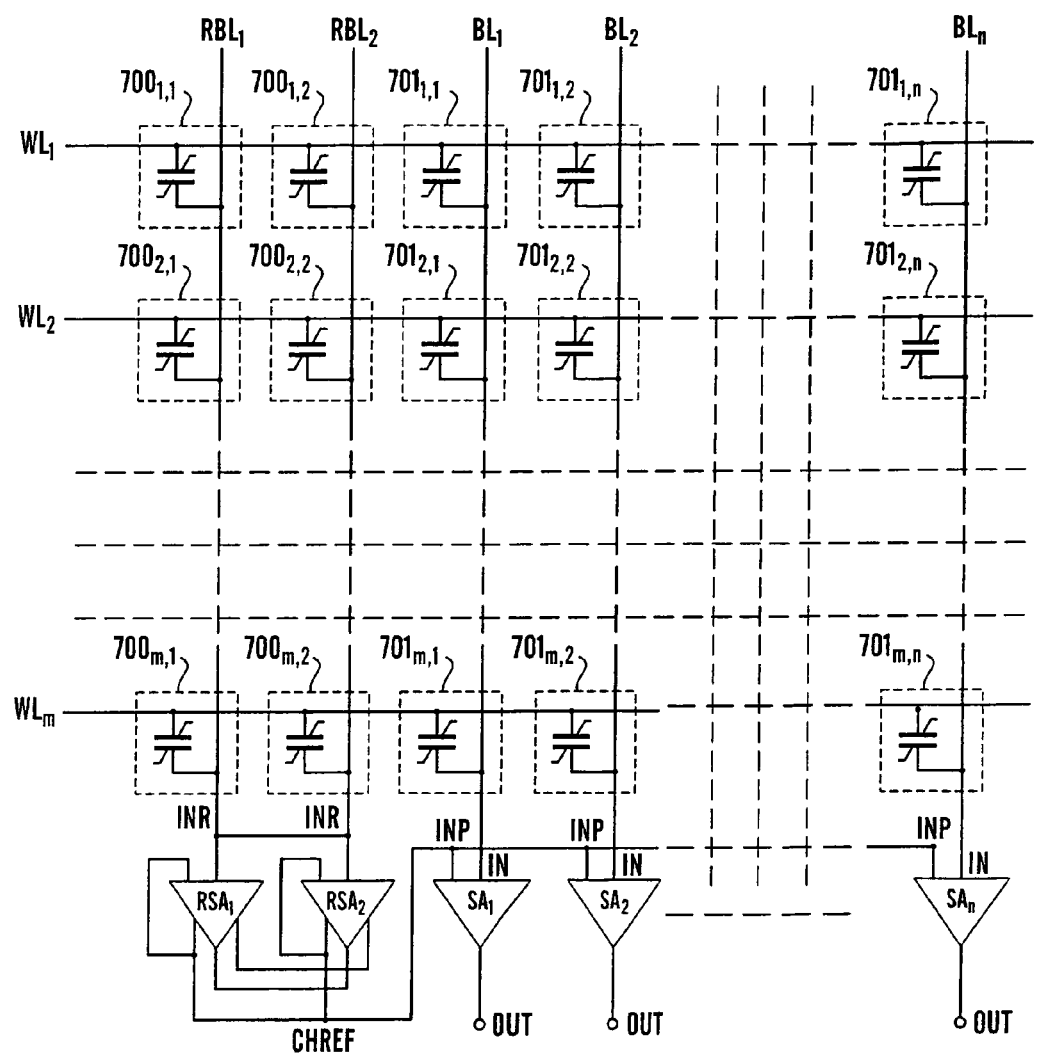
Figure 8:
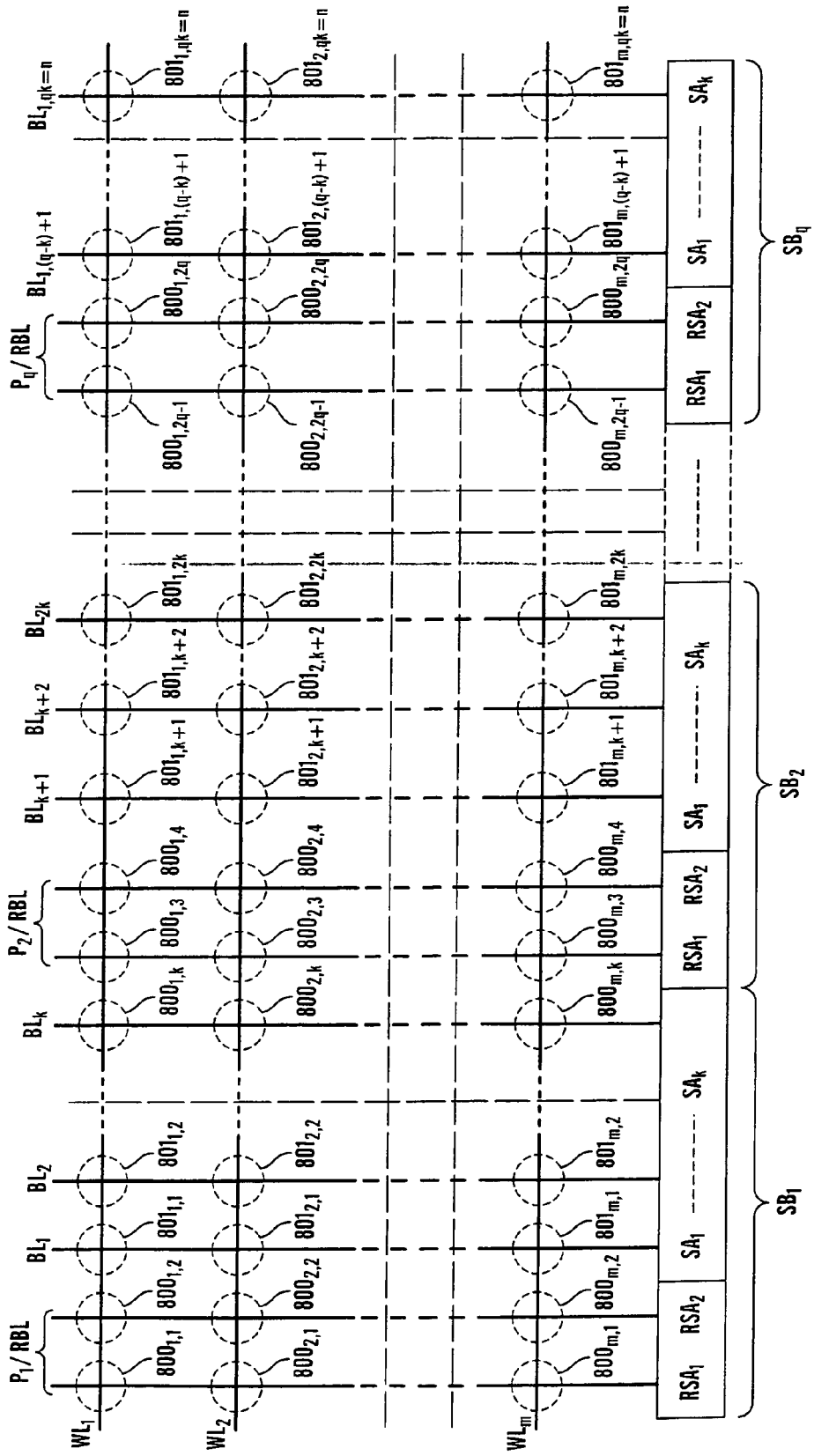
Figure 9:
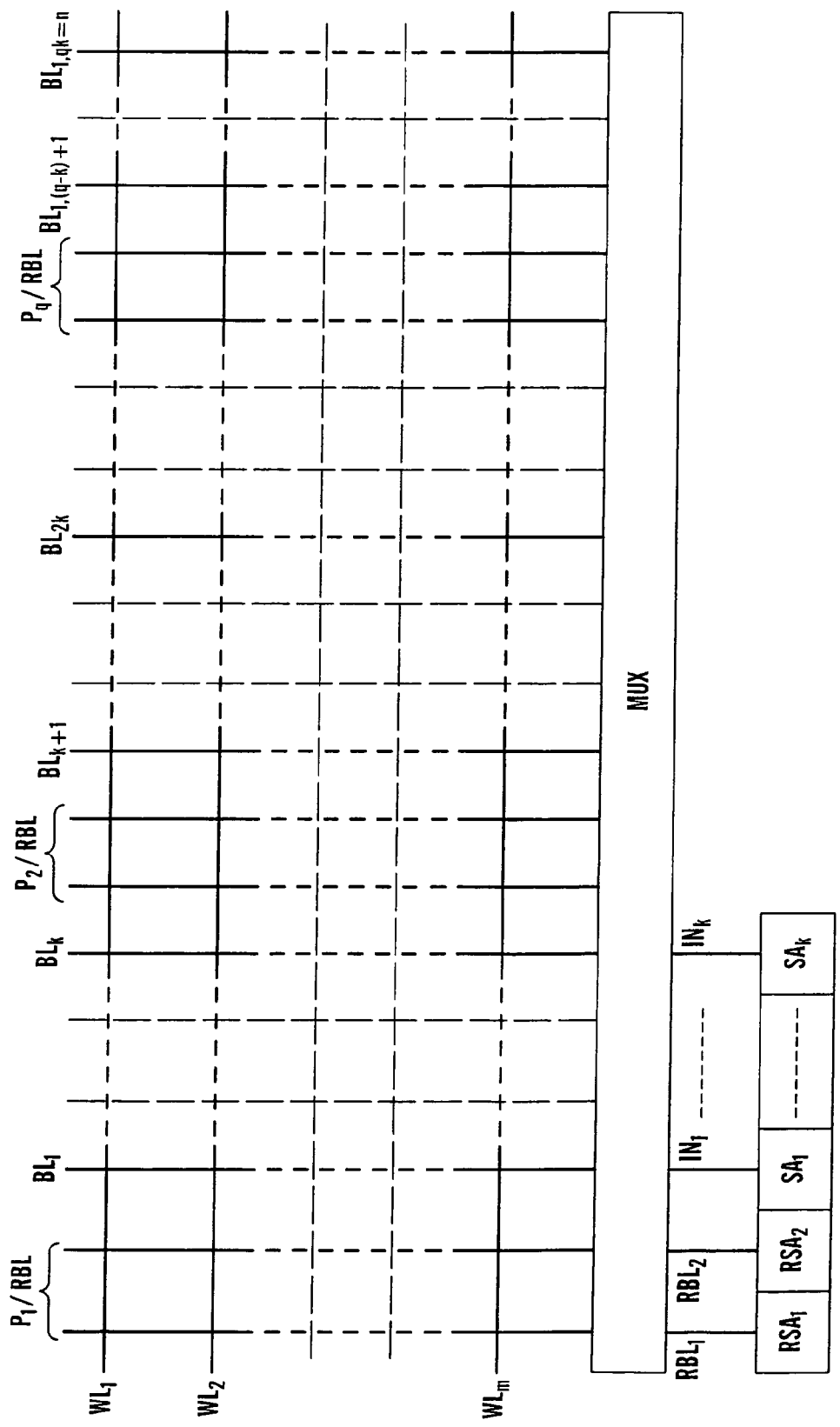

The present invention shall now be explained in greater detail by means of a discussion of exemplary embodiments thereof and in conjunction with the appended drawing figures, of which FIG. 1 shows a schematic hysteresis curve of a ferroelectric memory material, FIG. 2*a* a principle drawing of a passive matrix-addressable arrangement with crossing electrode lines, FIG. 2*b* a principle drawing of a passive matrix with cells containing ferroelectric material localized between the overlap of crossing electrode lines, FIG. 3 a block diagram of a memory device according to the present invention, FIG. 4 a circuit diagram of a preferred embodiment of a pseudo-differential sense amplifier circuit as used in the present invention, FIG. 5 a block diagram of a pseudo-differential sense amplifier system as used in the present invention, FIG. 6 a schematic block diagram of a general charge sensing device according to the present invention, FIG. 7 a charge sensing device according to the invention as provided in a passive matrix arrangement with crossing electrode lines similar to the arrangement shown in FIG. 2*a* and with charge-storing means connected between the crossing electrode lines, FIG. 8 a first embodiment of a passive matrix-addressable memory according to the invention, and incorporating the charge sensing device of the invention FIG. 9 a second embodiment of a passive matrix-addressable memory according to the invention, and incorporating the charge sensing device of the invention.

Before the present invention is explained with reference to preferred embodiments, a brief review of its general background shall be given with particular reference to the hysteresis of ferroelectric materials and the structure of matrix-addressable ferroelectric memories.

Referring to FIG. 1, a ferroelectric material with a hysteresis curve 100 changes its polarization direction upon application of an electric field that exceeds the coercive field $E_C$. The hysteresis curve is shown with the voltage rather than the field along the abscissa axis for reasons of convenience. The voltage is calculated by multiplying the field with the thickness of the ferroelectric material layer. A saturation polarization, $P_S$, occurs whenever a cross-point, i.e. a memory cell, is subject to the nominal switching voltage $V_S$. Once the electric field is removed the polarization will return to one of two remanent polarization states $+P_R$ at 110 and $-P_R$ at 112.

FIG. 2*a* shows a matrix of orthogonally intersecting electrodes lines. In order to conform to standard terminology, it is henceforth referred to the horizontal (row) electrode lines as word lines 200, abbreviated WL and to vertical (column) electrode lines as bit lines 210, abbreviated BL. During the drive and sense operations a selected word line 202 and one or more bit lines 212 are activated. It is desired to apply a voltage that is sufficiently high to switch a given memory cell 220, see FIG. 2*b*, either for defining a given polarization direction in that cell (writing), or for monitoring the preset polarization direction (reading). The ferroelectric material layer located between the electrodes 200, 210 functions like a ferroelectric capacitor 222. Accordingly, the cell 220 is selected by setting the potentials of the associated word line 202 and bit line 212 (the active lines) such that the difference equals the nominal switching voltage $V_S$. At the same time, the numerous word lines 200 and bit lines 210 that cross at cells 220 not addressed must be controlled in potential such that the disturbing voltages at these cells 220 are kept to a minimum.

It may be useful to review the overall function and structure of the passive matrix-addressable memory device in a generalized manner, with reference to FIG. 3 and which in the following by way of example is referred to as a ferroelectric memory, as generally known in the art, while according to the invention pseudo-differential sense amplifiers then are used for sensing the polarization states of ferroelectric memory cells.

FIG. 3 shows in a simplified block diagram form, the structure and/or functional elements of a matrix-addressable ferroelectric memory device according to the present invention. The memory macro 310 consists of a memory array 300, row and column decoders 32; 302, sense amplifiers 306, data latches 308 and redundant word and bit lines 304; 34. The memory array 300 contains the matrix of word lines 200 and bit lines 210. The row and column decoders 32; 302 decode the addresses of memory cells while sensing is performed by the sense amplifiers 306. The data latches 308 hold the data until part or all of the data is transferred to the memory control logic 320. The data read from the memory macro 310 will have a certain bit error rate (BER) which can be decreased by replacing defective word and bit lines in the memory array 300 with redundant word and bit lines 304; 34. In order to perform error detection the memory macro 310 may have data fields containing error correction code (ECC) information. The memory control logic 320 module provides a digital interface for the memory macro 310 and controls the reads and writes of the memory array 300. Memory initialisation and logic for replacing defective bit and word lines with redundant word and bit lines 304; 34 will be found in the memory control logic 320 as well. The device controller 330 connects the memory control logic 320 to external bus standards. A charge pump mechanism 340 generates some of the voltages needed to read and write the memory cells.

Specific and preferred embodiments as applied to storing and reading data to and from ferroelectric memory cells as have been discussed in the foregoing, shall now be described in relation to the more general problem of sensing the much smaller signals that result from reading of memory cells in passive matrix addressing memories. Particularly this trait is manifest in the difference in magnitude of the background currents in the active bit line and the charge emanating from an active cell being read.

The general solution to inaccurate amplification of the minute input signals as proposed by the present invention is to introduce an elaborate higher-gain switched-capacitor with auto-zero offset cancellation and excellent charge balance. This presupposes that a reference voltage is formed by using a pair of ferroelectric capacitors, each polarized to an opposite polarization state. The single-ended reference voltage generated from the reference cells can then be used to facilitate the comparison of memory cell signals generated by other ferroelectric capacitors since the background currents can be more easily compensated for.

A charge sensing device with a sense amplifier system as used with the memory device according to the invention shall now be described in greater detail with reference to FIGS. 4 and 5. FIG. 4 shows a circuit diagram of a pseudo-differential sense amplifier circuit and this sense amplifier circuit corresponds to the sense amplifier used in a sense amplifier system according to the invention as depicted in FIG. 5 wherein the sense amplifier circuits are denoted by the operational amplifier blocks 500, 502, 504. In FIG. 5 the operational amplifier blocks 502 and 504 represent two reference amplifiers which are connected in parallel. Two reference bit lines 508, 510 are joined together at the shared input viz. nodes INR of the two reference sense amplifiers 502, 504. Just prior to the read operation one of the two reference bit line elements 514a; 516a is written a logic 1 and the other is written a logic 0. Then during the read operation, the resulting voltage at node CHREF will therefore represent an average of a logic 1 and a logic 0 state. The resulting so-called charge reference at node CHREF is further amplified by the primary sense amplifier 500. The gain from node CHREF to the differential output $V_{outdiff} = SA_{outp} - SA_{outm}$ is such that the reference level given by the difference $V_{outdiff}$ will offset the charge injected by the active element at node INR by one-half of the voltage difference between a logic 1 and a logic 0. Under the assumption of a good matching between the bit line capacitance and the ferroelectric charge the $V_{outdiff}$ voltage corresponding to an active to a logic 1 and a logic 0 on an active bit line BL will be central at 0 V. In this manner a memory element in the logic 1 state will have a $V_{outdiff} > 0$ and a memory element in the logic 0 state a $V_{outdiff} < 0$. The $V_{outdiff}$ voltage is then latched to detect a logic state corresponding to the read data bit.

It is to be understood that the sense amplifier system in FIG. 5 may comprise a large number n of sense amplifiers 500 and hence element 530 in FIG. 5 represents the load capacitance of the not shown n−1 sense amplifiers identical to sense amplifier 500. In a practical embodiment hence the sense amplifier system as depicted in FIG. 5 has one node CHREF which is connected in common to e.g. 32 active sense amplifiers 500. In other words FIG. 5 represents a block of one node CHREF connected to n active sense amplifiers 500. It is to be understood that n can be chosen suitably large so that the sense amplifier system as used in the invention may contain a very large number of sense amplifiers 500 sharing the same node CHREF and two reference amplifiers 502, 504. Moreover each memory device may comprise a plurality of sense-amplifier system subblocks identical to the one shown in FIG. 5.

Now the circuit diagram of a pseudo-differential sense amplifier similar to one of the op-amp blocks 500, 502, 504 in FIG. 5 shall be described with reference to the circuit diagram in FIG. 4 which shows the circuit layout of a single pseudo-differential sense amplifier. It is to be understood that the circuit diagram in FIG. 4 is rather schematic and hence includes parasitic elements, which not at all are related to the circuit functionality. For instance the diodes 470a,b,c,d,e,f grounded respectively at 460a,b,c,d,e,f can be regarded as parasitic devices only and are in no way central to the operation of the sense amplifier circuit as such.

In a generally preferred embodiment of the present invention, the problem of having large background currents and small input signals is addressed by implementing pseudo-differential sense amplifiers which have balanced and symmetrical design. This shall now be explained with reference to the circuit diagram of the pseudo-differential sense amplifier in FIG. 4. In that connection the designation of the various nodes depicted in this figure shall also be used for referring to the voltages on these nodes.

A bias voltage $V_{biasp}$ is provided at the gate of current source transistor 400. The p-type current source transistor 400 has its source and substrate coupled to a voltage supply line V33. The drain of transistor 400 provides bias current to the common-source connection of p-type input differential-pair transistors 402, 404. To help minimize the die area, p-channel devices share common NWELL bodies wherever the biasing requirements for proper functionality allow. Hence, transistors 400, 402, and 404 share a common body that is contacted to line V33. The INP and INM inputs are coupled to the gates of the input differential-pair transistors 402 and 404 respectively. The drains of the input differential-pair transistors 402 and 404 drive the sources of the cascode stage transistors 410 and 412 respectively. This cascode stage dramatically improves the open-loop gain of the sense amplifier. Similarly, n-channel current-source biasing transistors 438 and 440 are cascoded with n-channel transistors 434 and 436 which also improves the sense-amplifier open-loop gain. The sense-amplifier output is taken as the difference between nodes OUTP and OUTM. The difference signal (OUTP–OUTM) is the voltage corresponding to the integrated charge difference between the active bit line (node 'IN' of FIG. 5) and the charge reference bit lines (nodes 'INR' of FIG. 5) at the end of a read cycle. p-channel transistors 406, 408, 422, 424, 426, 428 are all utilized as simple two-terminal MOS capacitors in the design of FIG. 4. Capacitive transistors 426, 428 provide common-mode feedback to the gates of current-source transistors 438, 440 at node VCM. During charge-integration, the VCM voltage is proportional to the common-mode output voltage (OUTP+OUTM)/2. Negative feedback through capacitive transistors 426, 428 at node VCM to the gates of current-source devices 438, 440 controls and maintains the common-mode output voltage during charge integration. In connection with the above discussion it should be noted that the input transistors equally could be n-channel transistors and the current source transistors p-channel transistors. In other words, the circuit implementation is not dependent on the conduction mode of the transistors in a given context, as long as the circuit functionality is maintained.

It will be seen that the pseudo-differential sense amplifier circuit comprises a switched capacitor common-mode feedback loop to control the output common-mode voltage. In other words, the common-mode feedback loop consists of capacitive elements or transistors 426, 428, n-channel current-source transistor 438, 440, 434, 436, and n-channel switch transistors 430, 432. At the start of each read cycle, switch transistors 430, 432 are closed (the voltage on nodes CMCP and CMCM is high) which nulls the voltage on the capacitive feedback transistors 426, 428. Next, the CMPC and CMCM voltages are pulled to low which turns off the switch transistors 430, 432, thereby establishing a capacitive feedback path from nodes OUTM, OUTP to node VCM and the gates of transistors 438, 440. Since the capacitive transistors 426, 428 match, only changes in the common-mode output (OUTP+OUTM)/2 will be transferred to node VCM, and the negative feedback thereby keeps the common-mode output voltage constant during the read cycle.

Also the pseudo-differential sense amplifier circuit comprises means for integral switched capacitor common-mode self-bias generation. The common-mode self-bias is generated when the switch transistors 430, 432 are closed (nodes CMCP and CMCM are pulled high) at the beginning of each read cycle. This establishes a common-mode bias-voltage equal to the voltage $V_{gs}$ of the current source transistors 438, 440 at node VCM.

During the read cycle, the sense amplifier 500 and reference amplifiers 502, 504 all function as integrators. The design in FIG. 4 is used for all three amplifiers 500, 502, 504 in FIG. 5. In particular, capacitive transistor 406 is the integrator feedback capacitor used in the sense amplifiers 500, 502, 504. During integration, the charge from node INR shown in FIG. 5 is integrated by the reference sense amplifiers 502 and 504 (connected in parallel) and is transferred to the respective transistors 406 thereof (also connected in parallel) of FIG. 4. The resulting voltage on the capacitive transistor 406 in each amplifier 502, 504 is inverted and buffered, and appears at node CHREF (FIG. 5). Likewise during integration, charge from node IN is integrated by sense amplifier 500 and is transferred to its capacitive transistor 406. The net result is that the charge-difference between nodes IN and INR is integrated and appears differentially as the difference output $SA_{outp} - SA_{outm}$. This difference is proportional to the charge difference $Q_{inr} - Q_{in}$.

A dummy integrator feedback transistor 408 is positioned on the reference side of each amplifier 500, 502, 504 in order to improve symmetry and balance. This p-type dummy transistor, or dummy gate capacitor, has its gate coupled to ground 462a and its source, drain and substrate coupled to the OUTM output. An auto-zero plus transistor 418 of n-type has its gate coupled to the auto-zero control plus (AZCP) signal, its source coupled to the INM input and its drain coupled to the OUTP output. Similarly, there is an auto-zero minus transistor 416 of n-type on the reference side with its gate coupled to the auto-zero control minus (AZCM) signal, with its source coupled to ground 462a and its drain coupled to the OUTM output. The auto-zero transistors 416, 418 perform the necessary switching for implementing the auto-zero mode. An n-type latch transistor 420 has its gate coupled to the latch (LTCH) signal, its source coupled to the INM input and its drain coupled to the gate of a p-type transistor 422 that functions as an MOS capacitor connected to node OUTM. At the end of the integration period, a logic 1 LTCH signal will turn on transistor 420 and connect the capacitive transistor 422 between nodes INM and OUTM, thereby introducing positive feedback that will 'latch' the output to the proper state. For better symmetry, similar transistors 414 and 424 are included, but do not provide additional positive feedback. As seen from FIG. 5 the LTCH signal is only utilized in sense amplifier 500. The LTCH signal is never activated (and therefore tied to ground) for the reference sense amplifiers 502, 504.

From the above section it will be seen that the pseudo-differential sense amplifier circuit comprises an integral positive feedback latch, the positive feedback being provided with a capacitive transistor 422 and the switch transistor 420. Regenerative positive feedback can be obtained by pulling the LTCH node high at the end of a read cycle. This will turn on the switch transistor 420, thereby providing positive feedback from the amplifier node OUTM back to the input node INM through the gate capacitance of the capacitive transistor 422.

It should be noted that all diodes indicated in FIG. 4 are reverse biased and are included for simulation purposes to more accurately model the NWELL capacitance associated with the various p-channel transistors. These diodes can in general be ignored for the purpose of this discussion.

n-channel transistors 430, 432 and are both controlled by the CMC signal of FIG. 5 (CMCP and CMCM are shorted in FIG. 5). Prior to charge integration, the voltage on capacitive transistors 426, 428 is zeroed by applying logic 1 level to CMC which turns on n-channel switches 430, 432. Switch transistors 430, 432 are then turned off on the falling edge of digital control signal CMC. This nulls the voltage on capacitive transistors 426, 428 thereby establishing the common-mode level at nodes OUTP, OUTM, and VCM.

As mentioned above, there is a common-mode transistor 432 in the amplifier circuit. This n-type transistor receives the common-mode control plus signal (CMCP) at its gate while the drain is coupled to the VCM control signal and the source is coupled to the OUTP output and ground 460e via diode 470e. The common-mode control minus CMCM signal feeds the gate of another common-mode transistor 430 located on the reference side. This latter n-type transistor has its drain coupled to the VCM control signal and the source coupled to the OUTM output and ground 460f via diode 470f.

Cascoding is practiced throughout the pseudo-differential sense amplifier design to the OUTP and OUTM outputs in order to increase the open-loop gain, as already mentioned. The common-mode feedback to the common gate node of the open-loop gain transistors 434, 436, 438, 440 controls the current, thereby maintaining output common-mode voltage control. A differential signal across OUTP and OUTM outputs has no effect on the VCM control signal.

During common-mode self-bias generation or refresh mode, common-mode transistors 430, 432, auto-zero transistors 416, 418 and latch transistors 414, 420 are all "closed", which means that the control signals AZCP, CMCP, CMCM and LTCH are all in a "high" logic state. This will refresh the common-mode voltage at the INP and INM inputs as well as at the OUTP and OUTM outputs of the sense amplifier circuit. In a next step, the auto-zero transistors 416, 418 remain "closed" while the sense amplifier circuit is placed in auto-zero mode. The control signals AZCP and LTCH are in the "high" logic state while control signals CMCP and CMCM switch to the "low" logic state at this point. This operation nullifies the offset of the amplifier circuit. Once it has settled, the amplifier circuit is placed in an amplifying mode where the control signals AZCP, CMCP, CMCM and LTCH are all in a "low" logic state and where common-mode transistors 430, 432, auto-zero transistors 416, 418 and latch transistors 414, 420 are all "open". The amplifier circuit will integrate the difference between the active bit line (the node IN in FIG. 5) and the charge reference (the node CHREF in FIG. 5) while in the amplifying mode. The amplifying mode ends with the control signal LTCH switching back to the "high" logic state, thereby creating a regenerative feedback and forcing the output at OUTP and OUTM outputs to latch based on the sign of the signal.

In connection with output common-mode voltage control and common-mode self-bias generation auto-zero offset cancellation is obtained. Specifically this will take place as follows. At the beginning of each read cycle node AZCP is pulled high. This closes the switch transistor 418 in each sense and reference amplifier, such that a bias voltage is established on nodes IN, INR and CHREF and this voltage equals the $V_{gs}$ of current source transistors 438, 440. After nodes CMCP and CMCM are pulled low with node AZCP remaining high, a small input offset voltage difference IN−INR=[(IN−CHREF)−(INR−CHREF)] appears between all active bit lines and their associated reference. Next, after node AZCP is pulled low, this offset voltage difference is sampled and held on the bit line capacitance, thereby initialising the voltage difference between the active bit lines and the reference bit lines to the input offset voltage of the pseudo-differential sense amplifier circuit. This effectively decreases the sense amplifier offset to an acceptably small level.

FIG. 5 shows a preferred embodiment of a charge sensing device with a pseudo-differential sense amplifier system for use in the present invention and capable of accurately amplifying a very tiny input signal. It conforms to an elaborate high-gain switched capacitor with auto-zero offset cancellation and excellent charge balance.

A first reference bit line 508 and a second reference bit line 510 are shorted together at node INR. The reference bit lines 508, 510 includes reference memory cells 514a, 514b, 516a, 516b and grounds 514c, 516c. The combination of reference memory cells 514b, 516b and grounds 514c, 516c correspond to inactive word lines 200. A supply voltage VS is fed to reference memory cells 514a, 516a of the active word lines 202. The INR node is amplified by the two reference amplifiers 502, 504 which are connected in parallel and which function as a buffer amplifier feeding the buffered INR signal to node CHREF. The two reference amplifiers 502, 504 and the first sense amplifier 500 all have a structure corresponding to that described in FIG. 4. The node CHREF, also known as the charge reference node, is the average of the charge associated with a logic "1" and a logic "0". In FIG. 5, the first reference bit line 508 corresponds to the charge of a logic "0" and the second reference bit line 510 corresponds to the charge of a logic "1". It should be noted that control signals AZCM and LTCH of the two reference amplifiers 502, 504 are coupled to grounds 528a, 528b.

The first reference amplifier 502 in parallel with the second reference amplifier 504 provide a buffered copy of the INR node to the CHREF node which subsequently serves as a common reference input to a group of sense amplifiers sharing the same CHREF signal. FIG. 5 shows only a first sense amplifier 500 from the mentioned group of sense amplifiers. Loading by the other sense amplifiers is included schematically with the CSAIN capacitor 530, schematically comprising capacitor 532 and ground 534. The first sense amplifier 500 will then amplify the difference between its associated bit line 506, labelled as node IN, and the CHREF node. The output of the first sense amplifier 500 is taken differentially between the nodes $SA_{outp}$ and $SA_{outm}$, and is converted to a digital logic level depending on the sign of the difference result. The entire group of sense amplifiers will function in the same manner as the first sense amplifier 500. The associated bit line 506 includes memory cells 512a, 512b, signal 518a and ground 526a. The two latter together form a row decoder 32. The signal 518a is the same as the supply signal VS used to charge the reference bit-line elements.

Further, there is another ground 528e shorting the AZCM control signal of the first sense amplifier 500. The control signals AZCP, CMCP, CMCM and LTCH of the first sense amplifier 500 are controlled by the digital control signals 518b, 518c, 518d and the coupled grounds 526b, 526c, 526d. Finally, the first sense amplifier 500 and the two reference amplifiers 502, 504 are provided with a gate source bias voltage from the associated arrangement 520, 522, 524 to their respective internal current source transistors 400.

The charge sensing device as shown in FIG. 5 can be regarded as a more elaborate version of a general charge sensing device with pseudo-differential sense amplifiers. It can be used in any application for sensing charges or for use with devices where there is an appropriate charge reference. This could of course be the case of ferroelectric memories where the memory cells are the individual charge storing means. The minimalist approach to a charge sensing device with a sense amplifier system is shown in FIG. 6, which can be regarded as a more generalized version of the embodiment in FIG. 5, but with only a single charge storing means or capacitor 601 corresponding to the capacitor 512a in FIG. 5. First and second charge reference means 600a, 600b are connected to the common input node AWL, which also is the input node of the capacitor 601. The charge reference means 600a, 600b corresponds to the capacitors 514a, 516a in FIG. 5. The charge references means 600a, 600b have respective output nodes $RBL_1$, $RBL_2$ which are short-circuited between the nodes INR and connected to input INM on each pseudo-differential reference sense amplifier $RSA_1$, $RSA_2$ which thus are connected in parallel and of course corresponds to the pseudo-differential sense amplifiers 502, 504 in FIG. 5. The pseudo-differential reference sense amplifiers $RSA_1$, $RSA_2$ have a common output node CHREF, which is connected with a reference input INP on a pseudo-differential sense amplifier SA. The charge storing means 601, the capacitance of which shall be sensed, has an output node ABL connected to an input on the sense amplifier SA. The connections in the arrangement in FIG. 6 are in all respects similar to those in FIG. 5 apart from having only a single charge storing means 600 and a single pseudo-differential sense amplifier SA.

The charge sensing device according to the invention and as shown in FIG. 6 can easily be adapted for the detection of charge values or polarization values of a plurality of charge storing means. This is shown in FIG. 7, which can be regarded as an elaboration of the charge sensing device according to the invention as shown in FIG. 5. It can also be regarded as an extension of the embodiment as rendered in FIG. 6, but now being arranged to detect charges stored on a plurality of charge storing means. In FIG. 7 these charge storing means are provided in the form of capacitors 700, 701 between common input nodes WL and common output nodes. Charge reference means 700, i.e. capacitors corresponding to the charge reference means 600a, 600b in FIG. 6 are connected in pairs with common input nodes $WL_1, \ldots WL_m$ and have common output nodes $RBL_1, RBL_2$, while the charge storing means or capacitors 701 have common output nodes $BL_1 \ldots BL_n$ as shown. The common output nodes $RBL_1, RBL_2$ of the charge reference means 700 are connected with inputs of respective reference sense amplifiers $RSA_1, RSA_2$ which has outputs connected with the common reference node CHREF. The connections are, apart from pairs of charge reference means 700 provided as shown, in all respects similar to those of FIG. 5 and in conformity with this figure a plurality of sense amplifiers $SA_1, \ldots SA_n$ is provided connected via their inputs IN with the respective common output nodes $BL_1, \ldots BL_n$ of the charge storing means 701. The common reference node CHREF is connected with input node INP of the respective sense amplifiers $SA_1, \ldots SA_n$. By comparing FIGS. 5 and 7 it will be seen that the latter actually has the same generic layout, but with the individual charge reference means and the charge storing means as well as the n sense amplifiers SA specifically depicted.

FIG. 7 shows how charge sensing device according to the present invention is embodied in a passive matrix-addressable arrangement where the common input nodes $WL_1 \ldots WL_m$ can be regarded as the word lines and the common output nodes $RBL_1, RBL_2; BL_1, \ldots BL_n$ can be regarded of the bit lines in an m·n matrix comprising of course m·n charge storing means 701 which then could be the memory cells of the passive ferroelectric memory matrix, while the appropriate charge references are provides by the m pairs of charge reference means 700 with the respective common output nodes $RBL_1, RBL_2$ which are reference bit lines of the memory matrix.

In the above-discussed preferred embodiment of the invention the charge sensing device as used in the memory device according to the invention comprises a sense amplifier block as shown in FIG. 5. This block could be termed a subblock of the charge sensing device, and it will be seen that if there is only one subblock, the sense amplifier subblock then will be identical to the sense amplifier system itself. In general a charge sensing device comprises as many sense amplifiers as there are bit lines in the memory device. In addition there are provided (at least) two reference bit lines in the memory device and connected with respectively (at least) two reference amplifiers of the charge sensing device. In practice the charge sensing device may comprise a plurality of subblocks and each of these subblocks although not specifically shown in FIG. 5, actually shall contain n sense amplifiers 500 for sensing the polarization of the memory cells used for data storage, as there in addition to the sense amplifier 500 depicted will be n−1 sense amplifiers represented by the capacitance 530 and of course connected in the same manner as 500 via common nodes CHREF to the reference sense amplifiers 502, 504. An arrangement of this kind will be provided for a full row read, i.e. the parallel readout of all memory cells on a single word line of the memory device. However, an embodiment as shown in FIG. 8 is preferable and desirable in order to provide an improved stabilization of the referencing procedure. This is done by dividing the sense amplifier block into identical subblocks SB, each subblock comprising a plurality k of sense amplifiers SA connectable to a similar number k of bit lines and two reference sense amplifiers $RSA_1$, $RSA_2$ in each subblock SB connectable to respectively the two reference bit lines of the pair P/RBL adjoining the memory bit lines BL assigned to the subblock SB. The reference bit lines RBL are forming the common output nodes of respective pair of reference memory cells 800. Hence with an appropriate number q of subblocks SB provided for parallel readout of all memory cells 801 on a single word line WL there will now in addition be pairs P/RBL of reference bit lines RBL, the number q of such pairs corresponding to the number q of subblocks. The effect is of course to distribute the reference bit lines RBL and reference memory cells 800 at specified positions throughout the memory matrix and increase the reliability of the referencing, as the contributions from sneak currents, disturb voltages, parasitic capacitances etc. to the actual polarization values read out from the memory cells 801 may vary over the memory array.

Each subblock comprises as stated k pseudo-differential sense amplifiers SA and all bit lines BL of the matrix is connected with a respective sense amplifier such that the embodiment in FIG. 8 comprises k·q=n sense amplifiers.

In many instances, particularly when the size of the memory array is large, i.e. the number of memory cells provided for data storage is large, and also with a correspondingly increasing data storage density obtained by reducing the pitch, i.e. either the distance from a word line or bit line to the next word line or bit line, including the first one, or by reducing the size in the memory cells, it shall be desirable to employ a number of sense amplifiers that is some fraction of the number n of bit lines in the device. This amounts to a so-called segmented word line structure, i.e. each word line WL is divided into segments comprising a specified number of memory cells and of course then the same number of bit lines. This embodiment is shown schematically in FIG. 9, where the memory cells located at word and bit line crossings for clarity's sake are not shown. A charge sensing device comprising a sense amplifier system (or a single sense amplifier block) will now be provided with a number k of sense amplifiers SA corresponding to the number k of bit lines BL in each word line segment. A multiplexer MUX or pass gate means is used for connecting the bit lines BL of each segment to corresponding sense amplifiers SA in the sense amplifier block. Hence all memory cells on a word line segment can be read in parallel, and by e.g. multiplexing, the same sense amplifiers now can be used for readout in parallel of each following word line segment in turn. This, of course, implies that the pair of reference sense amplifiers $RSA_1$, $RSA_2$ in the sense amplifier system or block similarly shall be connectable via the multiplexer MUX or pass gate means to the pair P/RBL of reference bit lines RBL for each word line segment. Specifically the arrangement will be such that the first sense amplifier $SA_1$ of the sense amplifier block senses the first bit line $BL_1$ in the first word line segment, the first bit line $BL_{k+1}$ in the second word line segment and so on, the second sense amplifier $SA_2$ of the sense amplifier system the second bit line $BL_2$ of the first line segment, the second bit line $BL_{k+2}$ of the second segment and so on.

It shall be understood that a typical application of the charge sensing device in the memory device according to the invention can involve the use of a large number of sense amplifier blocks and also the use of a large number of sense amplifiers in each block, but only one pair of reference amplifiers in each block. It should also be understood that the node CHREF in any case will be common to all sense amplifiers in a block. It is also to be understood that when using a segmented word line design and a multiplexed sense amplifier system as mentioned above, the sense amplifier system also then can be divided into a number of subblocks, implying that within each word line segment there can be corresponding numbers of pairs of reference bit lines. Each one of the pair of the reference bit lines is used for addressing a column of memory cells defined at the crossings between the reference bit lines and the word lines. The memory cells of the first reference bit line of the pair may be written to the logic 1 state, while the memory cells of the second reference bit line then are written to the logic 0 state. In destructive readout, either a polarization reversal or not shall take place in the memory cell. In the first case a large output, e.g. current signal, is obtained and the second case only a small output signal is obtained. An average of these output signals is generated and compared with the actual readout values from the data storing memory cells, the logic state thereof being given by the output either being larger or smaller than the average reference value.

Generally two reference cells shall be needed for a full row readout or a full word line segment readout. However, in an embodiment of the sense amplifier system in the memory device according to the invention only a single reference sense amplifier and a single reference bit line may be envisaged in the case where memory cells are read randomly and not in parallel. In this case, however, a pre-read cycle must be employed setting the reference memory cell on the active word line to either of the polarization states in turn and obtaining a reference value for each whereby the average thereof can be generated and input as a reference to the sense amplifier.

It will from what is said immediately hereinabove be appreciated by persons skilled in the art that the preceding detailed discussion of the preferred embodiment of the sense amplifier system in the memory device according to the invention has been given by way of example only, and should be evident that the charge sensing device can be modified in various ways without deviating from spirit or the scope of the present invention as defined in the claims appended hereto.

The invention claimed is:

1. A charge sensing device comprising charge reference means and sense amplifier system, for sensing the charge of a passive addressable charge-storing device, the system comprising a pair of a first and second charge references connected in parallel and similar to the charge-storing device, said first charge reference having the opposite polarization of the second charge reference, said first and second charge references and the charge storing device having a common input node; first and second pseudo-differential reference sense amplifiers both being connected with output nodes of the respective first and second charge reference, said first and second pseudo-differential reference sense amplifiers being adapted for generating output reference signals to a common reference node; and a pseudo-differential sense amplifier having a first input connected with the common reference node for receiving a common reference input signal and a second input for receiving an output signal from the charge-storing device; whereby the pseudo-differential sense amplifier is enabled to perform a threshold comparison and generating an output sense signal indicative of a polarization state of the charge-storing device.

2. A charge sensing device according to claim 1, wherein both the first and second pseudo-differential reference sense amplifiers and the pseudo-differential sense amplifier being identical pseudo-differential sense amplifier circuits.

3. A charge sensing device according to claim 2, wherein each pseudo-differential sense amplifier circuit comprises input differential pair transistors connected with a pair of cascaded transistors, and current source biasing pair transistors cascaded with a pair of transistors, said cascading in each case increasing sense amplifier open-loop gain.

4. A charge sensing device according to claim 3, wherein input transistors being p-channel transistors and the current source transistors n-channel transistors, or vice versa.

5. A charge sensing device according to claim 2, wherein each pseudo-differential sense amplifier circuit comprises a semi-balanced dual input with a balanced dual output.

6. A charge sensing device according to claim 2, wherein each pseudo-differential sense amplifier circuit comprises a switched capacitor common feed-back loop to control output common mode voltage.

7. A charge sensing device according to claim 2, wherein each pseudo-differential sense amplifier circuit comprises means for integral switched capacitor common mode self-bias generation.

8. A charge sensing device according to claim 2, wherein each pseudo-differential sense amplifier circuit comprises an integral positive feed-back latch.

9. A charge sensing device according to claim 2, wherein each pseudo-differential sense amplifier circuit comprises means for auto-zero offset cancellation.

10. A charge sensing device for sensing the charges of a plurality of passive addressable charge-storing device, comprising at least two pairs of a first and a second charge references similar to the charge-storing devices, said first charge reference having the opposite polarization of the second charge reference; each of said at least two pairs of charge references having a common input node and a pair of common output nodes respectively connected with said first and said second charge references in each of said at least two pairs thereof, each common input node of said at least two pairs of charge references moreover being connected with at least two charge-storing devices; first and second pseudo-differential reference sense amplifiers being respectively connected with said pair of common output nodes, said first and second pseudo-differential reference sense amplifiers being adapted for generating output reference signals to a common reference node; and at least two pseudo-differential sense amplifiers, each having a first input connected with said common reference node for receiving a common reference input signal and a second input respectively being connected with a common output node of respective one of said at least two charge storing devices for receiving respective output signals therefrom, said at least two charge-storing devices forming the elements of an orthogonal row and column array thereof and with each of the charge-storing devices of a row being connected to one of said at least two common input nodes and each of the charge storing devices of a column being connected to a common output node; whereby each pseudo-differential sense amplifier is enabled to perform a threshold comparison and generating an output sense signal indicative of a polarization state of a selected charge-storing device connected therewith.

11. A charge sensing device according to claim 10, wherein the common input nodes forming a portion of the word-line electrodes of a matrix-addressable array of charge-storing memory cells, said pair of common output nodes forming a pair of reference bit-line electrodes the common output nodes of the charge storing device forming bit-line electrodes of said matrix-addressable array; each of the reference bit-line electrodes being assigned to the first and second pseudo-differential reference sense amplifiers respectively; and each of the other bit-line electrodes being assigned to one of the pseudo-differential sense amplifiers, whereby in a readout cycle a polarization state of respective selected charge-storing memory cells can be detected either sequentially or in parallel and compared with a reference value.

12. A charge sensing device according to claim 11, wherein the charge sensing device being provided as a subblock in a block of more than one charge sensing device of this kind, such that the sense amplifiers of a subblock are assigned to a corresponding number of bit-line electrodes in the matrix-addressable array; and the pair of reference bit lines of respective subblocks being distributed among the bit lines of array.

13. A charge sensing device according to claim 11, wherein that the sense amplifier system comprises a multiplexer connected with the bit line electrodes of the matrix-addressable array; a number k of consecutive bit lines in the array defining a segment of all word-line electrodes therein, said number k of segment-defining bit lines corresponding to the number of pseudo-differential sense amplifiers in the charge sensing device; and a pair of reference bit line electrodes being provided adjacent to the bit line electrodes in each word line segment and connecting pairs of reference charge storing devices in each word line segment; whereby the charge-storing memory cells on a single word line electrode of a word line segment may be read in parallel, and all word line segments similarly in turn by applying an appropriate addressing protocol and multiplexing the bit-line electrodes of a selected word line segment to establish their parallel connection to respective pseudo-differential sense amplifiers of the charge sensing device as provided.

14. A non-volatile passive matrix-addressable memory device comprising an electrically polarizable dielectric memory material exhibiting hysteresis, particularly a ferroelectric or electret material, wherein said memory material is provided in a layer contacting a first set and second set of respective parallel addressing electrodes, wherein the electrodes of the first set constitute word lines of the memory device and are provided in substantially orthogonal relationship to the electrodes of the second set, the latter constituting bit lines of the memory device, wherein memory cells with a capacitor-like structure are defined in the memory material at the crossings between word lines and bit lines, wherein each memory cell can be selectively addressed for a write/read operation via a word line and bit line, wherein a write operation to a memory cell takes place by establishing a desired polarization state in the cell by means of a voltage being applied to the cell via the respective word line and bit line defining the cell, wherein said applied voltage either establishes a determined polarization state in the memory cell or is able to switch between the polarization states thereof, wherein a read operation takes place by applying a voltage to the memory cell and detecting at least one electrical parameter of an output current on the bit lines, wherein at least one charge sensing device is provided for sensing said polarization states of said memory cells during a read operation, and wherein said at least one charge sensing device is a pseudo-differential sense amplifier system comprising at least one system subblock, and that said at least one system subblock comprises at least one pseudo-differential sense amplifier circuit for sensing a polarization state of at least one memory cell during said read operation and two pseudo-differential reference sense amplifier circuits for sensing polarization states of two reference ferroelectric memory cells during said read operation, said two reference ferroelectric memory cells having opposite polarization states, said two pseudo-differential reference sense amplifier circuits being connected with said at least one pseudo-differential sense amplifier circuit via a common node.

15. A memory device according to claim 14, wherein said at least one system subblock comprises a plurality of said pseudo-differential sense amplifier circuits for sensing respective polarization states of a corresponding plurality of memory cells during said read operation.

16. A memory device according to claim 14, wherein said two pseudo-differential reference sense amplifier circuits are adapted for generating an average of a first and a second reference memory cell output signal to said common node, and that said at least one pseudo-differential sense amplifier circuit connected therewith is adapted for comparing the output signal at said common node with the output signal from a memory cell.

17. A memory device according to claim 14, wherein said at least one pseudo-differential sense amplifier circuit and said at least one pseudo-differential sense sense amplifier circuit are realized with identical amplifier circuitry.

18. A memory device according to claim 17, wherein said identical amplifier circuitry comprises a reference side and an array side, said reference side mirroring the circuit structure of said array side.

19. A memory device according to claim 14, wherein said pseudo-differential sense amplifier system comprises a plurality of system subblocks.

20. A memory device according to claim 19, wherein each subblock comprises a plurality of one pseudo-differential sense amplifier circuits for sensing the polarization state of a corresponding number of memory cells.

* * * * *